United States Patent
Kim et al.

(10) Patent No.: US 11,856,809 B2
(45) Date of Patent: Dec. 26, 2023

(54) METHOD OF SCREENING FOR ELECTRON TRANSPORT MATERIAL AND HOLE BLOCKING MATERIAL USED IN ORGANIC LIGHT EMITTING DEVICE

(71) Applicant: LG CHEM, LTD., Seoul (KR)

(72) Inventors: Ji Hye Kim, Daejeon (KR); Sung Kil Hong, Daejeon (KR); Minseung Chun, Daejeon (KR); Yeon Hwan Kim, Daejeon (KR); Jae Tak Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 502 days.

(21) Appl. No.: 17/274,012

(22) PCT Filed: Jan. 31, 2020

(86) PCT No.: PCT/KR2020/001464
§ 371 (c)(1),
(2) Date: Mar. 5, 2021

(87) PCT Pub. No.: WO2020/159275
PCT Pub. Date: Aug. 6, 2020

(65) Prior Publication Data
US 2021/0320255 A1    Oct. 14, 2021

(30) Foreign Application Priority Data

Feb. 1, 2019    (KR) .................. 10-2019-0013442

(51) Int. Cl.
*H10K 50/16*    (2023.01)
*H10K 71/70*    (2023.01)
(Continued)

(52) U.S. Cl.
CPC ............. *H10K 50/16* (2023.02); *H10K 71/00* (2023.02); *H10K 71/70* (2023.02); *H10K 85/633* (2023.02);
(Continued)

(58) Field of Classification Search
CPC ........ H10K 50/16; H10K 50/18; H10K 71/70; H10K 85/633; H10K 85/636;
(Continued)

(56) References Cited

U.S. PATENT DOCUMENTS

2004/0251816 A1    12/2004    Leo et al.
2015/0357578 A1    12/2015    Kim et al.
(Continued)

FOREIGN PATENT DOCUMENTS

JP      2018-037570 A    3/2018
KR    10-2000-0051826 A    8/2000
(Continued)

OTHER PUBLICATIONS

Ardila et al., "Square-Wave Adsorptive Stripping Voltammetric Determination of Nanomolar Levels of Bezafibrate Using a Glassy Carbon Electrode Modified With Multi-Walled Carbon Nanotubes Within a Dihexadecyl Hydrogen Phosphate Film", Analyst, 2014, 139, pp. 1762-1768.
(Continued)

*Primary Examiner* — Joseph C. Nicely
(74) *Attorney, Agent, or Firm* — Bryan Cave Leighton Paisner LLP

(57) ABSTRACT

A method of screening for an electron transport material included in an electron transport layer of an organic light emitting device and a method of screening for a hole blocking material included in a hole blocking layer of the organic light emitting device, the method using a heterogeneous electron transfer rate constant (K) value to select the
(Continued)

electron transport material and an electron donating rate constant $k_d$ to select the hole blocking material, thereby capable of realizing the organic light emitting device having an excellent balance between luminous efficiency and lifetime.

7 Claims, 4 Drawing Sheets

(51) Int. Cl.
  *H10K 71/00* (2023.01)
  *H10K 85/60* (2023.01)
  *H10K 50/18* (2023.01)
  *H10K 101/50* (2023.01)

(52) U.S. Cl.
  CPC ......... *H10K 85/636* (2023.02); *H10K 85/654* (2023.02); *H10K 85/6574* (2023.02); *H10K 50/18* (2023.02); *H10K 85/615* (2023.02); *H10K 85/6572* (2023.02); *H10K 2101/50* (2023.02)

(58) Field of Classification Search
  CPC ............. H10K 85/654; H10K 85/6574; H10K 85/615; H10K 85/6572; H10K 2101/50
  See application file for complete search history.

(56) References Cited

U.S. PATENT DOCUMENTS

| | | |
|---|---|---|
| 2016/0233429 A1 | 8/2016 | Xia et al. |
| 2018/0099986 A1 | 4/2018 | Mazaheripour et al. |
| 2018/0269402 A1 | 9/2018 | Huh et al. |
| 2019/0296243 A1 | 9/2019 | Suh et al. |
| 2022/0093873 A1* | 3/2022 | Kim ................. C07D 251/24 |
| 2022/0376178 A1* | 11/2022 | Ha ....................... H10K 85/636 |
| 2022/0376182 A1* | 11/2022 | Kubota ................ C07D 401/04 |
| 2023/0024114 A1* | 1/2023 | Ha ..................... H10K 85/6572 |

FOREIGN PATENT DOCUMENTS

| | | |
|---|---|---|
| KR | 10-2015-0142709 A | 12/2015 |
| KR | 10-2016-0060539 A | 5/2016 |
| KR | 10-2016-0065264 A | 6/2016 |
| KR | 10-2018-0047601 A | 5/2018 |
| KR | 10-2018-0103021 A | 9/2018 |
| WO | 2003-012890 A2 | 2/2003 |

OTHER PUBLICATIONS

Ivic et al., "A Chemometrical Analysis of Voltammetric Data for Simultaneous Determination of Phenobarbital Sodium and Paracetamol Obtained at a Gold Electrode", Int. J. Electrochem. Sci., 11(2016), pp. 5935-5951.

Zhong et al., "New Conjugated Triazine Based Molecular Materials for Application in Optoelectronic Devices: Design, Synthesis, and Properties", J. Phys. Chem. C 2011, 115, pp. 2423-2427.

\* cited by examiner

【FIG. 1】

| |
|---|
| 6 |
| 5 |
| 4 |
| 3 |
| 2 |
| 1 |

【FIG. 2】

| |
|---|
| 6 |
| 10 |
| 5 |
| 9 |
| 4 |
| 8 |
| 3 |
| 7 |
| 2 |
| 1 |

[FIG. 3]
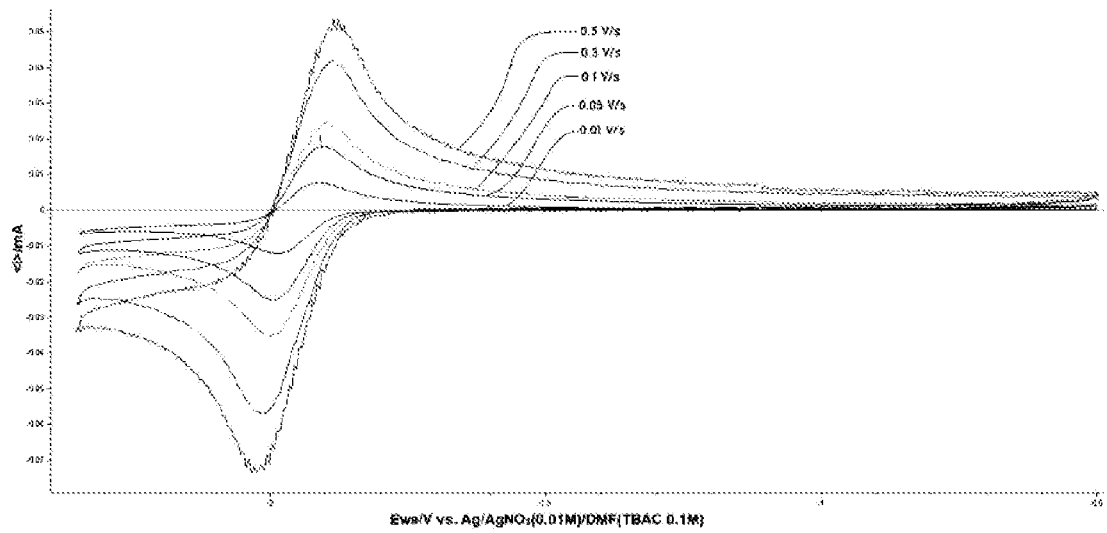
[FIG. 4]
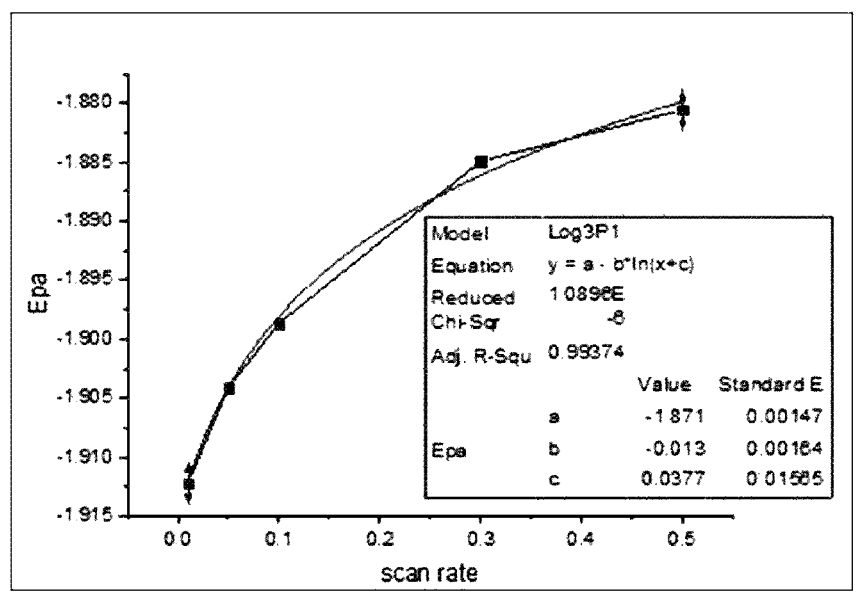

[FIG. 5]
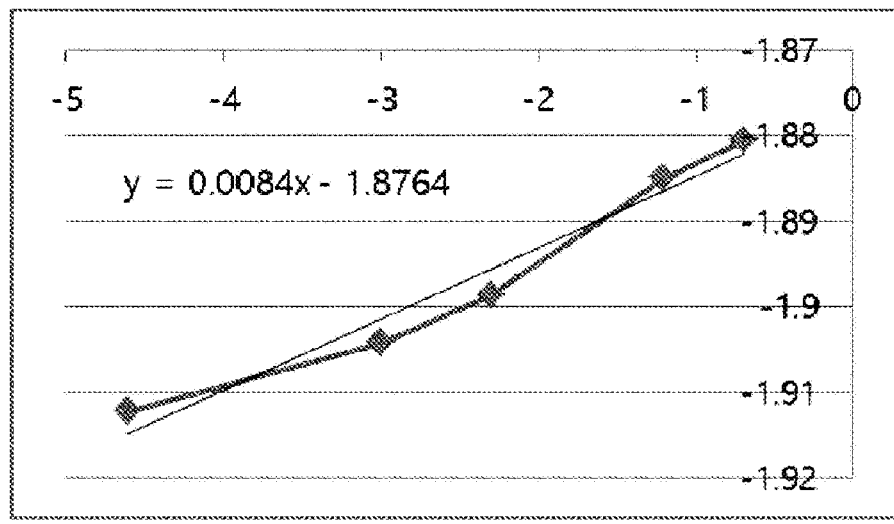
[FIG. 6]
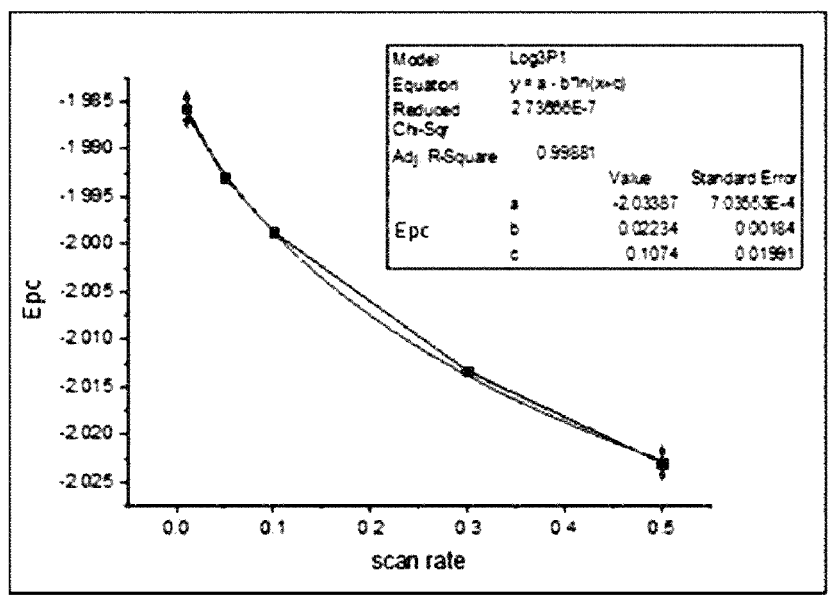

[FIG. 7]
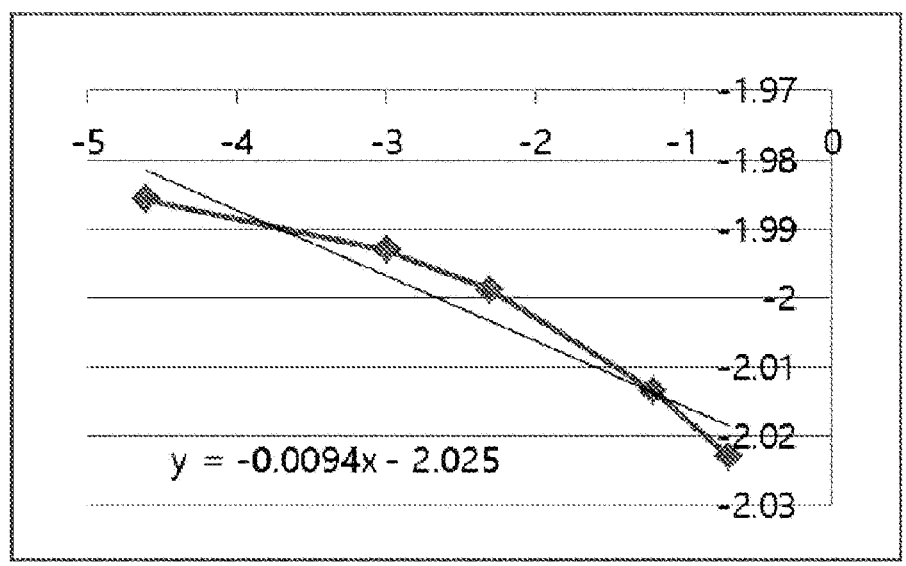

METHOD OF SCREENING FOR ELECTRON TRANSPORT MATERIAL AND HOLE BLOCKING MATERIAL USED IN ORGANIC LIGHT EMITTING DEVICE

CROSS-REFERENCE TO RELATED APPLICATION(S)

This application is a National Stage Application of International Application No. PCT/KR2020/001464 filed on Jan. 31, 2020, which claims priority to Korean Patent Application No. 10-2019-0013442 filed on Feb. 1, 2019, disclosures of which are hereby incorporated by reference herein in their entireties.

TECHNICAL FIELD

The present disclosure relates to a method of screening for an electron transport material which may be used as a material of an electron transport layer of an organic light emitting device and a method of screening for a hole blocking material which may be used as a material of a hole blocking layer.

BACKGROUND

In general, an organic light emitting phenomenon refers to a phenomenon where electric energy is converted into light energy by using an organic material. An organic light emitting device using the organic light emitting phenomenon has a wide viewing angle, an excellent contrast, and a fast response time, and has excellent luminance, driving voltage, and response speed characteristics, and thus a number of studies are being conducted.

The organic light emitting device generally has a structure which includes an anode, a cathode, and an organic material layer interposed between the anode and the cathode. The organic material layer frequently have a multilayered structure that includes different materials in order to enhance efficiency and stability of the organic light emitting device, and for example, the organic material layer may be formed of a hole injection layer, a hole transport layer, a light emitting layer, a hole blocking layer, an electron transport layer, an electron injection layer, etc. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

New materials for the organic material used in the organic light emitting device as described above have been continuously developed. In particular, as the weight and thickness of organic light emitting devices are reduced, it is required to develop a material capable of realizing a device with an excellent balance between efficiency and lifetime. However, in order to find such a material, there has been an inconvenience in that characteristics of a device should be examined by directly employing the material in the device.

Accordingly, there is a demand for a method capable of easily selecting a material for realizing a desired level of characteristics of an organic light emitting device by examining effects of the material on the organic light emitting device without manufacturing the organic light emitting device.

RELATED ARTS (Patent Literature 0001) Korean Patent Publication No. 10-2000-0051826

SUMMARY

Technical Problem

The present disclosure provides a method of screening for an electron transport material included in an electron transport layer of an organic light emitting device and a method of screening for a hole blocking material included in a hole blocking layer of the organic light emitting device.

Technical Solution

To achieve the above object, the present disclosure provides a method of screening for an electron transport material included in an electron transport layer of an organic light emitting device, the method including the steps of:
1) calculating heterogeneous electron transfer rate constant (K) of electron transport material candidates by the following Mathematical equation 1; and
2) determining an electron transport material candidate of which the heterogeneous electron transfer rate constant (K) value calculated by the following Mathematical equation 1 is 1.2 to 1.65 as the electron transport material of the organic light emitting device:

$$K = \frac{k_d + k_a}{2} \quad \text{[Mathematical equation 1]}$$

in Mathematical Equation 1,
$k_d$ (donating k) represents an electron donating rate constant and $k_a$ (accepting k) represents an electron accepting rate constant.

Further, there is provided a method of screening for a hole blocking material included in a hole blocking layer of an organic light emitting device, the method including the steps of:
i) calculating electron donating rate constants $k_d$ (donating k) of hole blocking material candidates by the following Mathematical equation 2-1; and
ii) determining a hole blocking material candidate of which the electron donating rate constant $k_d$ (donating k) value calculated by the following Mathematical equation 2-1 is 1.25 to 2.25 as the hole blocking material of the organic light emitting device:

$$E_{pa} = E_a^{0\prime} - \left(\frac{RT}{anF}\right)\ln\left(\frac{RTk_d}{anF}\right) + \left(\frac{RT}{anF}\right)\ln v \quad \text{[Mathematical equation 2-1]}$$

in Mathematical equation 2-1,
$E_{pa}$ represents an anodic peak potential at a maximum current, $E_a^{0\prime}$ represents a formal potential at an anodic peak, v represents a scan rate, a represents an electron transfer coefficient, n represents the number of electrons, F represents the Faraday constant (96480 C/mol), R represents the gas constant (8.314 $mol^{-1}K^{-1}$), and T represents the absolute temperature (298 K).

Advantageous Effects

The above-described method of screening for an electron transport material included in an electron transport layer of an organic light emitting device may be used to select an electron transport material having a heterogeneous electron transfer rate constant (K) value in a specific range from electron transport material candidates, thereby realizing an organic light emitting device having an excellent balance between luminous efficiency and lifetime.

Further, the above-described method of screening for a hole blocking material included in a hole blocking layer of an organic light emitting device may be used to select a hole blocking material having an electron donating rate constant $k_d$ (donating k) value in a specific range from hole blocking material candidates, thereby realizing an organic light emitting device having an excellent balance between luminous efficiency and lifetime.

DESCRIPTION OF THE DRAWINGS

FIG. 1 illustrates an example of an organic light emitting device including a substrate 1, an anode 2, a hole transport layer 3, a light emitting layer 4, an electron transport layer 5, and a cathode 6;

FIG. 2 illustrates an example of an organic light emitting device including a substrate 1, an anode 2, a hole injection layer 7, a hole transport layer 3, an electron blocking layer 8, a light emitting layer 4, a hole blocking layer 9, an electron transport layer 5, an electron injection layer 10, and a cathode 6;

FIG. 3 shows a current-potential (C-V) curve according to cyclic voltammetry of an electron transport material candidate 1-1;

FIG. 4 shows a plot of an anodic peak potential ($E_{pa}$) versus a scan rate (V/s) obtained from an anodic peak of the C-V curve of the electron transport material candidate 1-1;

FIG. 5 shows a plot of the anodic peak potential ($E_{pa}$) versus ln(v) of the electron transport material candidate 1-1;

FIG. 6 shows a plot of a cathodic peak potential ($E_{pc}$) versus a scan rate (V/s) obtained from a cathodic peak of the C-V curve of the electron transport material candidate 1-1; and FIG. 7 shows a plot of the cathodic peak potential ($E_{pc}$) versus ln(v) of the electron transport material candidate 1-1.

DETAILED DESCRIPTION

Hereinafter, the present disclosure will be described in more detail for better understanding.

The terms used in this specification are just for explaining exemplary embodiments and it is not intended to restrict the present disclosure. The singular expression may include the plural expression unless it is differently expressed contextually. It must be understood that the term "include", "equip", or "have" in the present specification is only used for designating the existence of characteristics taken effect, numbers, steps, components, or combinations thereof, and do not exclude the existence or the possibility of addition of one or more different characteristics, numbers, steps, components, or combinations thereof beforehand.

Further, in the present specification, when a layer or an element is mentioned to be formed "on" or "above" layers or elements, it means that each layer or element is directly formed on the layers or elements, or other layers or elements may be formed between the layers, subjects, or substrates.

The present disclosure may be variously modified and have various forms, and specific examples are exemplified and explained in detail below. However, it is not intended to limit the present disclosure to the specific examples and it must be understood that the present disclosure includes every modifications, equivalents, or replacements included in the spirit and technical scope of the present disclosure.

Meanwhile, as used herein, the term 'screening method', which is a method of selecting or exploring a desired material among various candidates, refers to a method of selecting or exploring a material that enables a device to exhibit excellent characteristics by calculating specific parameter values with respect to candidates without examining characteristics of organic light emitting devices manufactured by using various candidates which are applicable to the organic light emitting device.

Method of Screening for Electron Transport Material Included in Electron Transport Layer of Organic Light Emitting Device As used herein, the 'method of screening for an electron transport material' refers to a method of determining, as the electron transport material, a material having a heterogeneous electron transfer rate constant (K) value in a predetermined range, after calculating the heterogeneous electron transfer rate constant (K) with respect to electron transport material candidates which are applicable to an electron transport layer of an organic light emitting device.

Further, the 'electron transport material candidate' refers to a material which is likely to be included in an electron transport layer of an organic light emitting device, and any material may be employed without limitation, as long as it is usually employed in the electron transport layer of the organic light emitting device, and receives electrons from a cathode to transfer the electrons to a light emitting layer because of having large electron mobility.

A material having a lowest unoccupied molecular orbital (LUMO) energy level suitable for easily injecting the injected electrons into the light emitting layer while having a large difference in highest occupied molecular orbital (HOMO) energy level from the light emitting layer such that injection of holes from the light emitting layer to the electron transport layer is prevented is known to be suitable as the electron transport material candidates.

However, HOMO and LUMO energy levels have limitations in determining the electron mobility of the electron transport material candidates, and therefore, even though HOMO and LUMO energy levels thereof are measured, it is not easy to examine efficiency and/or lifetime tendency of organic light emitting devices. For this reason, the only method to identify a material capable of increasing the balance between efficiency and lifetime of the organic light emitting device is to examine characteristics of all respective devices by using respective materials as a material for the electron transport layer.

Accordingly, the present inventors considered that a heterogeneous electron transfer rate constant (K) is suitable as a parameter to understand the electron transport properties of electron transport material candidates which may be included in an electron transport layer of an organic light emitting device, and they found that when a candidate having a heterogeneous electron transfer rate constant (K) value in a specific range is selected and employed to manufacture an organic light emitting device, the organic light emitting device exhibits an excellent balance between luminous efficiency and lifetime, thereby completing the present disclosure.

Specifically, the electron transfer rate constant (K) is a parameter reflecting that a reaction (reduction reaction) of receiving electrons from a cathode by an electron transport material as an electron acceptor and a reaction (oxidation reaction) of transporting electrons to a light emitting layer by the electron transport material as an electron donor is not a reversible reaction but a quasi-reversible reaction.

Generally, to examine electrochemical behaviors of oxidation and reduction reactions, linear sweep voltammetry (LSV) and cyclic voltammetry (CV) are frequently used. These two methods are common in that a voltage is scanned at a constant rate with respect to a working electrode where the reaction of interest occurs, and the resulting current change is measured. However, of them, cyclic voltammetry (CV) is useful in that whether or not the reaction is reversible may be determined by repeatedly measuring the experiment for each cycle.

In the cyclic voltammetry (CV), in the case of a reversible reaction, oxidation/reduction rates are influenced only by an electron transfer rate, i.e., an electron diffusion rate, and anodic peak potential and cathodic peak potential do not change with the scan rate. Thus, the electron transfer rate in the reversible reaction may be obtained by calculating a diffusion coefficient (D) satisfying the Randles-Sevcik Mathematical equation represented by the following Mathematical equation 3:

$$i_p = 0.4463 nFAC \left(\frac{nFvD}{RT}\right)^{\frac{1}{2}} \qquad \text{[Mathematical equation 3]}$$

in Mathematical equation 3,
$i_p$ represents a peak current, n represents the number of electrons, F represents the Faraday constant (96480 C/mol), A represents an electrode area, C represents a molar concentration, v represents a scan rate, R represents the gas constant (8.314 mol$^{-1}$K$^{-1}$), T represents the absolute temperature (298 K), and D represents a diffusion coefficient.

In other words, a C-V curve of a subject material is obtained with varying a scan rate, and then the diffusion coefficient (D) may be obtained from the slope of a plot where the x-axis is the square root of the scan rate (v$^{1/2}$) and the y-axis is the peak current ($i_p$).

In contrast, in the case of a quasi-reversible reaction, such as the reaction of the electron transport material in the electron transport layer of the organic light emitting device, the reaction rate is slower than the scan rate, and thus the electron transfer rate may not be obtained from the diffusion rate as in the reversible reaction. Instead, since the anodic and cathodic peaks shift according to the scan rate, the electron transfer rate may be determined by peak shift according to the scan rate. In the present disclosure, the Laviron Mathematical equation represented by the following Mathematical equation 4 was used as an Mathematical equation for calculating the electron transfer rate constant (k) in the quasi-reversible reaction:

$$E_p = E^{0'} + \left(\frac{RT}{\alpha nF}\right)\ln\left(\frac{RTk}{\alpha nF}\right) + \left(\frac{RT}{\alpha nF}\right)\ln v \qquad \text{[Mathematical equation 4]}$$

in Mathematical equation 4,
$E_p$ represents a peak potential, $E^{0'}$ represents a formal potential, v represents a scan rate, a represents an electron transfer coefficient, n represents the number of electrons, F represents the Faraday constant (96480 C/mol), R represents the gas constant (8.314 mol$^{-1}$K$^{-1}$), and T represents the absolute temperature (298 K).

However, since the electron transfer rate constants, each obtained from anodic peak and cathodic peak of the electron transport material, are different from each other, it is necessary to consider all of them for more accurate examination of the electron transfer rate.

Accordingly, in the present disclosure, the electron transfer rate constant obtained from the anodic peak, i.e., the electron donating rate constant $k_d$ (donating k) and the electron transfer rate constant obtained from the cathodic peak, i.e., the electron accepting rate constant $k_a$ (accepting k) are calculated, respectively, and then a mean value thereof is defined as the heterogeneous electron transfer rate constant (K) of the electron transport material, thereby determining electron transport properties of the electron transport material.

Hereinafter, each step of a method of screening for an electron transport material by calculating a heterogeneous electron transfer rate constant (K) value will be described in detail.

Step of Calculating Heterogeneous Electron Transfer Rate Constant (K) of Electron Transport Material Candidate by Mathematical Equation 1 (Step 1)

This step is a step of calculating a heterogeneous electron transfer rate constant (K) by the following Mathematical equation 1 in order to examine electron transport properties of electron transport material candidates which are applicable to an electron transport layer of an organic light emitting device:

$$K = \frac{k_d + k_a}{2} \qquad \text{[Mathematical equation 1]}$$

in Mathematical equation 1,
$k_d$ (donating k) represents an electron donating rate constant and $k_a$ (accepting k) represents an electron accepting rate constant.

Specifically, $k_d$ (donating k) of Mathematical equation 1 represents an electron donating rate constant satisfying the following Mathematical equation 2-1, which is obtained from an anodic peak of a current-potential (C-V) curve according to cyclic voltammetry of the electron transport material candidate, $$E_{pa} = E_a^{0'} - \left(\frac{RT}{\alpha nF}\right)\ln\left(\frac{RTk_d}{\alpha nF}\right) + \left(\frac{RT}{\alpha nF}\right)\ln v \qquad \text{[Mathematical equation 2-1]}$$

in Mathematical equation 2-1,
$E_{pa}$ represents an anodic peak potential at a maximum current, $E_a^{0'}$ represents a formal potential at an anodic peak, v represents a scan rate, α represents an electron transfer coefficient, n represents the number of electrons, F represents the Faraday constant (96480 C/mol), R represents the gas constant (8.314 mol$^{-1}$K$^{-1}$), and T represents the absolute temperature (298 K),
$k_a$ (accepting k) represents an electron accepting rate constant satisfying the following Mathematical equation 2-2, which is obtained from a cathodic peak of the C-V curve according to cyclic voltammetry of the electron transport material candidate, $$E_{pc} = E_c^{0'} + \left(\frac{RT}{\alpha nF}\right)\ln\left(\frac{RTk_a}{\alpha nF}\right) - \left(\frac{RT}{\alpha nF}\right)\ln v \qquad \text{[Mathematical equation 2-2]}$$

$E_{pc}$ represents a cathodic peak potential at a minimum current, $E_c^{0'}$ represents a formal potential at a cathodic peak, and v, α, n, F, R and T are the same as defined in Mathematical equation 2-1.

The heterogeneous electron transfer rate constant (K) of the electron transport material candidate is calculated by using an electron donating rate constant $k_d$ (donating k) value obtained from an anodic peak of a current-potential (C-V) curve and an electron accepting rate constant $k_a$ (accepting k) value obtained from a cathodic peak of the C-V curve, after dissolving the electron transport material candidate in dimethylformamide (DMF), and plotting the C-V curve according to cyclic voltammetry.

The properties of electron transfer from the electron transport material to a metal complex compound and the electron transfer properties of the electron transport material transporting electrons from the cathode to the light emitting layer may be identified through the electron transfer rate constant obtained from the anodic peak, i.e., the electron donating rate constant $k_d$ (donating k), and the properties of electron transfer from the metal complex compound to the electron transport material may be identified through the electron transfer rate constant obtained from the cathodic peak, i.e., the electron accepting rate constant $k_a$ (accepting k).

Hereinafter, the method of calculating the heterogeneous electron transfer rate constant (K) of the electron transport material candidate will be described in detail.

First, the electron transport material candidate is dissolved in dimethylformamide (DMF) at a concentration of 3 mM, and then a current-potential (C-V) curve according to cyclic voltammetry of the electron transport material is obtained with varying the scan rate.

In this regard, the C-V graph of the electron transport material candidate is preferably measured at a scan rate of 0.01 V/s to 0.5 V/s. For example, the C-V graph of the electron transport material candidate may be measured at a scan rate (V/s) of 0.01, 0.05, 0.1, 0.3, and 0.5, respectively.

Next, a method of calculating the electron donating rate constant $k_d$ (donating k) of the electron transport material candidate is as follows:

a1) From the anodic peak of the C-V curve, a graph where the x-axis is the scan rate (V/s) and the y-axis is the anodic peak potential ($E_{pa}$) is plotted. A formal potential ($E_a^{0'}$) value when x is 0 (the scan rate is 0) is obtained therefrom;
b1) Further, from the anodic peak of the C-V curve, a graph where the x-axis is ln(v) and the y-axis is the anodic peak potential ($E_{pa}$) is plotted. After fitting the graph to a straight line, the slope and the y-intercept are obtained therefrom;
c1) By using the slope and the y-intercept obtained as above, the electron donating rate constant $k_d$ (donating k) satisfying the following Mathematical equation 2-1 is calculated:

$$E_{pa} = E_a^{0'} - \left(\frac{RT}{\alpha nF}\right)\ln\left(\frac{RTk_d}{\alpha nF}\right) + \left(\frac{RT}{\alpha nF}\right)\ln v \quad \text{[Mathematical equation 2-1]}$$

in Mathematical equation 2-1,
$E_{pa}$ represents an anodic peak potential at a maximum current, $E_a^{0'}$ represents a formal potential at an anodic peak, v represents a scan rate, α represents an electron transfer coefficient, n represents the number of electrons, F represents the Faraday constant (96480 C/mol), R represents the gas constant (8.314 mol$^{-1}$K$^{-1}$), and T represents the absolute temperature (298 K), and the y-intercept obtained in the step b1) corresponds to $$E_a^{0'} - \left(\frac{RT}{\alpha nF}\right)\ln\left(\frac{RTk_d}{\alpha nF}\right),$$

and therefore, the formal potential ($E_a^{0'}$) value obtained in the step a1) and the slope $$\left(\frac{RT}{\alpha nF}\right)$$

value obtained in the step b1) may be used to calculate the $k_d$ (donating k) value.

Next, a method of calculating the electron accepting rate constant $k_a$ (accepting k) of the electron transport material candidate is as follows:

a2) From the cathodic peak of the C-V curve, a graph where the x-axis is the scan rate (V/s) and the y-axis is the cathodic peak potential ($E_{pc}$) is plotted. A formal potential ($E_c^{0'}$) value when x is 0 (the scan rate is 0) is obtained therefrom;
b2) Further, from the cathodic peak of the C-V curve, a graph where the x-axis is ln(v) and the y-axis is the cathodic peak potential ($E_{pc}$) is plotted. After fitting the graph to a straight line, the slope and the y-intercept are obtained therefrom;
c2) By using the slope and the y-intercept obtained as above, the electron accepting rate constant $k_a$ (accepting k) satisfying the following Mathematical equation 2-2 is calculated:

$$E_{pc} = E_c^{0'} + \left(\frac{RT}{\alpha nF}\right)\ln\left(\frac{RTk_a}{\alpha nF}\right) - \left(\frac{RT}{\alpha nF}\right)\ln v \quad \text{[Mathematical equation 2-2]}$$

$E_{pc}$ represents a cathodic peak potential at a minimum current, $E_c^{0'}$ represents a formal potential at a cathodic peak, and v, α, n, F, R, and T are the same as defined in Mathematical equation 2-1, and
the y-intercept obtained in the step b2) corresponds to $$E_c^{0'} + \left(\frac{RT}{\alpha nF}\right)\ln\left(\frac{RTk_a}{\alpha nF}\right),$$

and therefore, the formal potential ($E_c^{0'}$) value obtained in the step a2) and the slope $$-\left(\frac{RT}{\alpha nF}\right)$$

value obtained in the step b2) may be used to calculate the $k_a$ (accepting k) value.

The obtained electron donating rate constant $k_d$ (donating k) and electron accepting rate constant $k_a$ (accepting k) of the electron transport material candidate are averaged as in Mathematical equation 1 to obtain the heterogeneous electron transfer rate constant (K) of the electron transport material candidate.

Step of Determining Electron Transport Material Candidate Having Heterogeneous Electron Transfer Rate Constant (K) Value Calculated by Mathematical Equation 1 in a Range of 1.2 to 1.65 as Electron Transport Material of Organic Light Emitting Device (Step 2)

This step is a step of determining, as the electron transport material applicable to an electron transport layer of an organic light emitting device, an electron transport material candidate having a heterogeneous electron transfer rate constant (K) value of 1.2 to 1.65, among electron transport material candidates.

In this regard, the organic light emitting device includes an anode; a cathode disposed opposite to the anode; a light emitting layer disposed between the anode and the cathode; a hole transport layer disposed between the anode and the light emitting layer; and an electron transport layer disposed between the light emitting layer and the cathode,
wherein the electron transport material refers to a material included in the electron transport layer.

When the heterogeneous electron transfer rate constant (K) of the electron transport material candidate is less than 1.2, charge transfer between the electron transport material and the metal complex compound is not easy when the candidate is used as the electron transport material, and thus transfer of electrons from the cathode to the light emitting layer is difficult. Accordingly, there is a problem that a driving voltage of the organic light emitting device may increase and the efficiency thereof may decrease. Further, when the heterogeneous electron transfer rate constant (K) of the electron transport material candidate is more than 1.65, excess electrons are transferred to the light emitting layer when the candidate is used as the electron transport material, and thus an electron-hole balance in the light emitting layer may be disturbed. This causes a problem of lifetime reduction of the organic light emitting device.

In contrast, when the organic light emitting device includes the electron transport material having the heterogeneous electron transfer rate constant (K) value in the above-described range, the number of electrons transferred from the cathode to the light emitting layer may be efficiently controlled, and as a result, a balance between luminous efficiency and lifetime may become excellent.

Meanwhile, the electron transport material is preferably included, together with a metal complex compound, in the electron transport layer.

The metal complex compound refers to a complex of a metal selected from the group consisting of alkali metals, alkaline earth metals, transition metals, and metals of Group 13 in the periodic table. The metal complex compound induces an increase of dipole moment in the electron transport layer to improve electron injection efficiency from the cathode, and therefore, luminous efficiency may be increased, as compared with an organic light emitting device having an electron transport layer including only the electron transport material.

Preferably, the metal complex compound may be represented by the following Chemical Formula 3, wherein M represents a central metal, $L_{11}$ represents a main ligand, and $L_{12}$ represents an ancillary ligand:

$$M(L_{11})_{n1}(L_{12})_{n2} \quad \text{[Chemical Formula 3]}$$

in Chemical Formula 3,
M is lithium, beryllium, manganese, copper, zinc, aluminum, or gallium,
$L_{11}$ is halogen, or 8-hydroxyquinolinato substituted or unsubstituted with $C_{1-4}$ alkyl; or halogen, or 10-hydroxybenzo[h]quinolinato substituted or unsubstituted with $C_{1-4}$ alkyl, $L_{12}$ is halogen; phenolato substituted or unsubstituted with $C_{1-4}$ alkyl; or naphtholato substituted or unsubstituted with $C_{1-4}$ alkyl,
n1 is 1, 2, or 3,
n2 is 0 or 1, and
n1+n2 is 1, 2, or 3,
wherein when n1 is 2 or more, 2 or more of $L_{11}$ are the same as or different from each other.

Alternatively, $L_{11}$ is 8-hydroxyquinolinato, 2-methyl-8-hydroxyquinolinato, or 10-hydroxybenzo[h]quinolinato, and
$L_{12}$ is chloro, o-cresolato, or 2-naphtholato.

Most preferably, the metal complex compound is any one selected from the group consisting of 8-hydroxyquinolinato lithium (LiQ), bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, and bis(2-methyl-8-quinolinato)(2-naphtholato)gallium.

In this regard, the electron transport layer preferably includes the electron transport material and the metal complex compound at a weight ratio of 70:30 to 30:70. When satisfying the above-described range, charge transfer between the electron transport material and the metal complex compound easily occurs, and at the same time, electron mobility predicted by the heterogeneous electron transfer rate constant of the electron transport material may exhibit high reliability.

Meanwhile, configurations of the organic light emitting device, other than the above-described electron transport layer and hole blocking layer, are not particularly limited, as long as they may be used in organic light emitting devices. Examples thereof may include the following configurations.

First, the anode and the cathode of the organic light emitting device include an anode material and a cathode material, respectively.

As the anode material, generally, a material having a large work function is preferably used so that holes may be easily injected into the organic material layer. Specific examples of the anode material include metals such as vanadium, chrome, copper, zinc, and gold, or an alloy thereof; metal oxides such as zinc oxide, indium oxide, indium tin oxide (ITO), and indium zinc oxide (IZO); a combination of metals and oxides, such as $ZnO:Al$ or $SnO_2:Sb$; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons may be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2/Al$, and the like, but are not limited thereto.

Further, the organic light emitting device may further include, on the anode, a hole injection layer injecting holes from the electrode. The hole injection layer is composed of a hole injection material, and the hole injection material is preferably a compound which has an ability to transport the holes, a hole injection effect in the anode, and an excellent hole injection effect to the light emitting layer or the light emitting material, prevents movement of an exciton generated in the light emitting layer to the electron injection layer or the electron injection material, and has an excellent thin film forming ability. It is preferable that a highest occupied molecular orbital (HOMO) of the hole injection material is between the work function of the anode material and a HOMO of a peripheral organic material layer.

Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline, and polythiophene-based conductive polymer, etc., but are not limited thereto.

Further, the hole transport layer of the organic light emitting device is a layer that is disposed on the anode or the hole injection layer, and receives holes from the hole injection layer and transports the holes to the light emitting layer.

The hole transport layer is composed of a hole transport material, and the hole transport material is suitably a material having large mobility to the holes, which may receive holes from the anode or the hole injection layer to transfer the holes to the light emitting layer. Specific examples thereof include an arylamine-based organic material, a conductive polymer, a block copolymer in which a conjugate portion and a non-conjugate portion are present together, etc., but are not limited thereto.

Further, the organic light emitting device may further include an electron blocking layer between the hole transport layer and the light emitting layer. Preferably, the electron blocking layer is disposed in contact with the light emitting layer, and prevents excess electron transfer to increase probability of hole-electron recombination, thereby improving efficiency of the organic light emitting device. The electron blocking layer includes an electron blocking material. The electron blocking material may include arylamine-based organic materials, but is not limited thereto.

Further, the light emitting layer of the organic light emitting device is a layer that emits light in the visible light region by combining holes and electrons, each transported from the hole transport layer and the electron transport layer. The light emitting layer preferably includes a material having high quantum efficiency for fluorescence or phosphorescence. Specifically, the light emitting layer may include a host material and a dopant material.

The host material may include a condensed aromatic ring derivative, a hetero ring-containing compound, etc. Specifically, the condensed aromatic ring derivative includes an anthracene derivative, a pyrene derivative, a naphthalene derivative, a pentacene derivative, a phenanthrene compound, a fluoranthene compound, etc., and the hetero ring-containing compound includes a carbazole derivative, a dibenzofuran derivative, a ladder-type furan compound, a pyrimidine derivative, etc., but are not limited thereto.

The dopant material includes an aromatic amine derivative, a styrylamine compound, a boron complex, a fluoranthene compound, a metal complex, etc. Specifically, the aromatic amine derivative is a condensed aromatic ring derivative having a substituted or unsubstituted arylamino group, and includes a pyrene, an anthracene, a chrysene, a periflanthene, etc., which has an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, etc., but are not limited thereto. Further, the metal complex includes an iridium complex, a platinum complex, etc., but is not limited thereto.

Further, the organic light emitting device may further include an electron injection layer between the electron transport layer and the cathode. The electron injection layer is a layer that injects electrons from the electrode, and a compound which has an ability to transport the electrons, an electron injection effect from the cathode, and an excellent electron injection effect to the light emitting layer or the light emitting material, prevents movement of an exciton generated in the light emitting layer to the hole injection layer, and has an excellent thin film forming ability is preferable.

Specific examples of the materials that may be used for the electron injection layer include LiF, NaCl, CsF, $Li_2O$, BaO, fluorenone, anthraquinodimethane, diphenoquinone, thiopyran dioxide, oxazole, oxadiazole, triazole, imidazole, perylene tetracarboxylic acid, fluorenylidene methane, anthrone and derivatives thereof, a metal complex compound, a nitrogen-containing 5-membered ring derivative, etc., but are not limited thereto. Here, as the metal complex compound, the above-described metal complex compound which may be used in the electron transport layer may be used. For example, those the same as the metal complex compound used in the electron transport layer may be used, but different metal complex compounds may also be used.

A structure of the organic light emitting device which may employ the electron transport material selected by the above-described method of screening for an electron transport material according to one embodiment is illustrated in FIG. 1. FIG. 1 illustrates an example of an organic light emitting device including a substrate 1, an anode 2, a hole transport layer 3, a light emitting layer 4, an electron transport layer 5, and a cathode 6. In such a structure, a material which is selected from the electron transport material candidates because it has a heterogeneous electron transfer rate constant (K) of 1.2 to 1.65, may be included as the electron transport material in the electron transport layer 5.

FIG. 2 illustrates an example of an organic light emitting device including a substrate 1, an anode 2, a hole injection layer 7, a hole transport layer 3, an electron blocking layer 8, a light emitting layer 4, a hole blocking layer 9, an electron transport layer 5, an electron injection layer 10, and a cathode 6. In such a structure, a material which is selected from the electron transport material candidates because it has a heterogeneous electron transfer rate constant (K) of 1.2 to 1.65, may be included as the electron transport material in the electron transport layer 5, and a material which is selected from the hole blocking material candidates described below because it has an electron donating rate constant $k_d$ (donating k) value of 1.25 to 2.25, may be included as the hole blocking material in the hole blocking layer 9.

The organic light emitting device according to the present disclosure may be manufactured by sequentially stacking the above-described components. In this case, the organic light emitting device may be manufactured by depositing a metal or a metal oxide having conductivity or an alloy thereof on a substrate to form an anode by using a physical vapor deposition (PVD) method such as sputtering or e-beam evaporation, forming the above-described respective layers thereon, and then depositing thereon a material which may be used as a cathode. In addition to the method described above, an organic light emitting device may be made by sequentially depositing a cathode material, an organic material layer, and an anode material on a substrate. Further, the light emitting layer may be formed by subjecting a host and a dopant to a vacuum deposition method as well as a solution coating method. Here, the solution coating method means spin coating, dip coating, doctor blading, inkjet printing, screen printing, a spray method, roll coating, etc., but is not limited thereto.

In addition to such a method, the organic light emitting device may be manufactured by sequentially depositing a cathode material, an organic material layer, and an anode material on a substrate (WO 2003/012890). However, the manufacturing method is not limited thereto.

Meanwhile, the organic light emitting device may be a front side emission type, a back side emission type, or a double side emission type according to the used material.

Method of Screening for Hole Blocking Material Included in Hole Blocking Layer of Organic Light Emitting Device As used herein, the 'method of screening for a hole blocking material' refers to a method of determining, as the hole blocking material, a material having an electron donating rate constant $k_d$ (donating k) value in a predetermined range after calculating the electron donating rate constant $k_d$ (donating k) with respect to hole blocking material candidates which may be used in a hole blocking layer of an organic light emitting device.

Further, the 'hole blocking material candidate' refers to a material which is likely to be included in a hole blocking layer of an organic light emitting device, and any material may be employed without limitation, as long as it is a material which is usually employed in the hole blocking layer of the organic light emitting device, and confines an exciton formation area to the light emitting layer to increase probability of electron/hole recombination.

In this regard, in order to examine the electron transport properties of the electron transport material included in the electron transport layer, charge transfer between the electron transport material and the metal complex compound should be considered to consider the electron donating rate constant $k_d$ (donating k) as well as the electron accepting rate constant $k_a$ (accepting k). However, with regard to the hole blocking material included in the hole blocking layer, its electron transport properties may be examined only by considering its role of transporting the electrons from the electron transport layer to the light emitting layer.

Therefore, in the case of screening for a hole blocking material to improve characteristics of the organic light emitting device, it is preferable to consider only the electron donating rate constant $k_d$ (donating k) representing electron donating properties of the hole blocking material.

Hereinafter, each step of a method of screening for a hole blocking material by calculating an electron donating rate constant $k_d$ (donating k) value will be described in detail.

Step of Calculating Electron Donating Rate Constant $k_d$ of Hole Blocking Material Candidate by Mathematical Equation 2-1 (Step i)

This step is a step of calculating an electron donating rate constant $k_d$ (donating k) by Mathematical equation 2-1 in order to examine electron transport properties of hole blocking material candidates which are applicable to a hole blocking layer of an organic light emitting device.

In this regard, the electron donating rate constant $k_d$ (donating k) of the hole blocking material candidate may be calculated in the same manner as in the electron donating rate constant $k_d$ (donating k) of the electron transport material candidate. In other words, since the electron transport by the hole blocking material in the hole blocking layer of the organic light emitting device also occurs by a quasi-reversible reaction, the value may be calculated using the Laviron Mathematical equation represented by Mathematical equation 4, as in the method of calculating $k_d$ (donating k) value of the electron transport material candidate.

Specifically, the electron donating rate constant $k_d$ (donating k) of the hole blocking material candidate is obtained from an anodic peak of a current-potential (C-V) curve, after dissolving the hole blocking material candidate in dimethylformamide (DMF), and plotting the C-V curve according to cyclic voltammetry.

First, the hole blocking material candidate is dissolved in dimethylformamide (DMF) at a concentration of 3 mM, and then a current-potential (C-V) curve according to cyclic voltammetry of the hole blocking material is obtained with varying the scan rate. Preferably, the C-V graph of the hole blocking material candidate is preferably measured at a scan rate of 0.01 V/s to 0.5 V/s. For example, the C-V graph of the hole blocking material candidate may be measured at a scan rate (V/s) of 0.01, 0.05, 0.1, 0.3 and 0.5, respectively. Then, the $k_d$ (donating k) value is calculated with reference to the above-described method of the electron transport material candidate.

Step of Determining Hole Blocking Material Candidate Having Electron Donating Rate Constant $k_d$ Calculated by Mathematical Equation 2-1 in a range of 1.25 to 2.25 as Hole Blocking Material of Organic Light Emitting Device (Step ii)

This step is a step of determining, as the hole blocking material applicable to a hole blocking layer of an organic light emitting device, a material having the electron donating rate constant $k_d$ (donating k) value of 1.25 to 2.25, among hole blocking material candidates.

In this regard, the organic light emitting device includes an anode; a cathode disposed opposite to the anode; a light emitting layer disposed between the anode and the cathode; a hole transport layer disposed between the anode and the light emitting layer; an electron transport layer disposed between the light emitting layer and the cathode; and a hole blocking layer disposed between the light emitting layer and the electron transport layer, wherein the hole blocking material refers to a material included in the hole blocking layer.

Preferably, the hole blocking layer is composed of only the hole blocking material.

When $k_d$ (donating k) of the hole blocking material candidate is less than 1.25, electron transport ability is decreased when the candidate is used as the hole blocking material, and thus the number of electrons transported to the light emitting layer is decreased to cause an increase in a driving voltage or a decrease in efficiency. When $k_d$ (donating k) of the hole blocking material candidate is more than 2.25, an electron-hole balance is impaired to cause a problem of lifetime reduction when the candidate is used as the hole blocking material. Accordingly, when a material satisfying $k_d$ (donating k) value in the above-described range is selected and used as the hole blocking material, characteristics of an organic light emitting device may be improved.

Meanwhile, configurations of the organic light emitting device, other than the above-described hole blocking layer, are not particularly limited, as long as they may be used in organic light emitting devices. The configurations may be described by referring to those described in the method of screening for the electron transport material.

The method of screening for the electron transport material and the method of screening for the hole blocking material will be described in detail in the following examples. However, the following examples are presented Experimental Example 1: Method of Screening for Electron Transport Material (Step 1) Calculation of Heterogeneous Electron Transfer Rate Constant (K) of Electron Transport Material Candidates With respect to the following electron transport material candidates 1-1 to 1-11, each including N atom-containing 6-membered heteroaromatic ring, a heterogeneous electron transfer rate constant (K) was calculated by the following method, respectively.

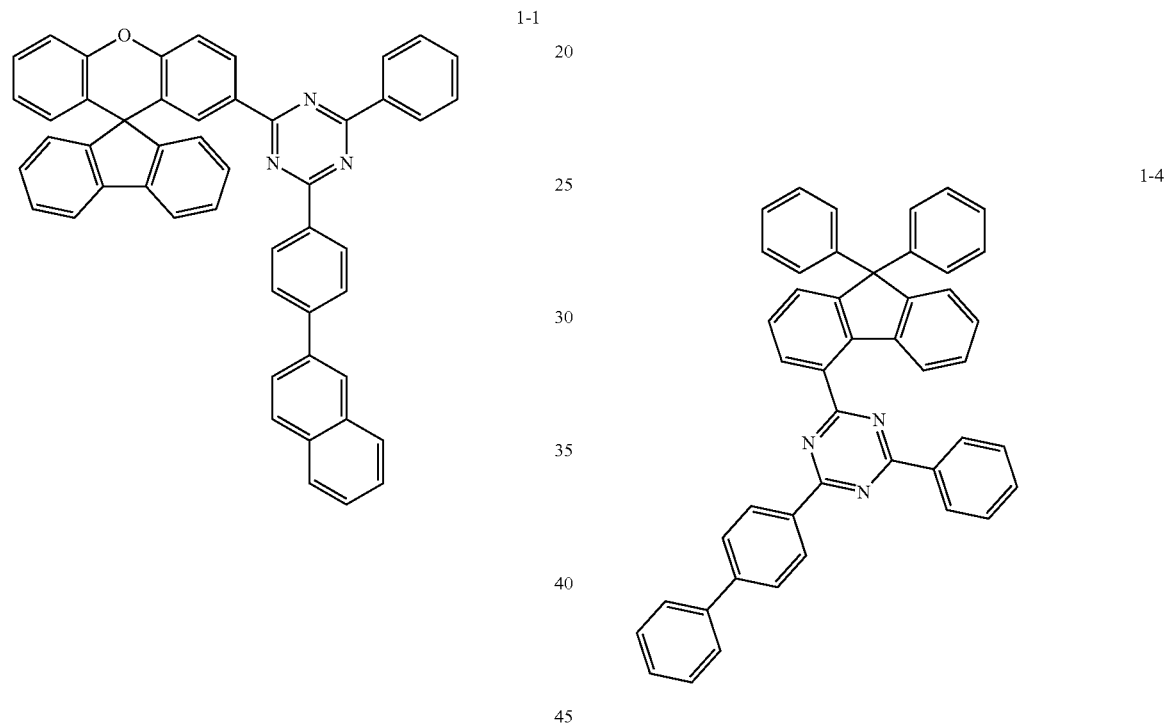

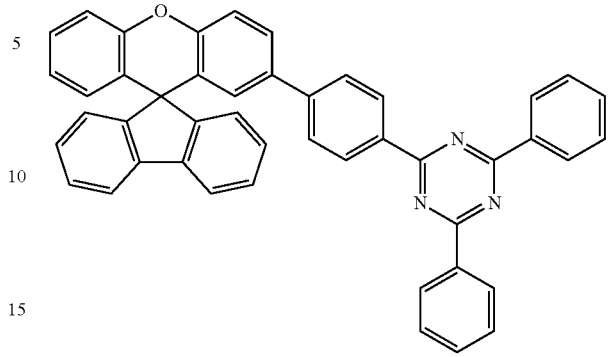

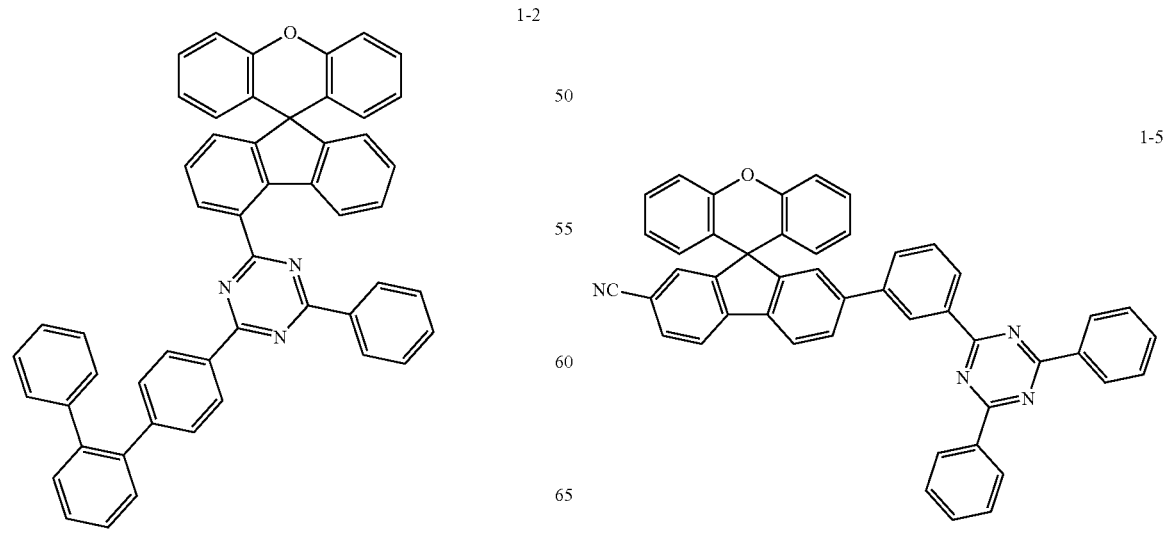

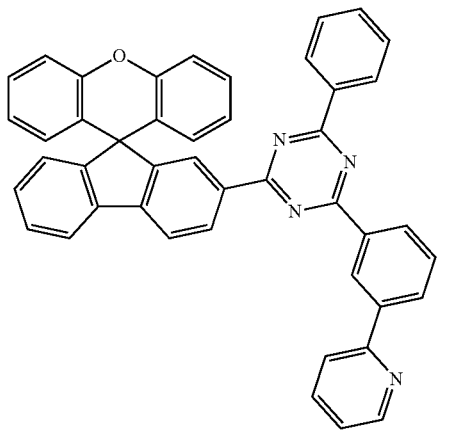

1-6

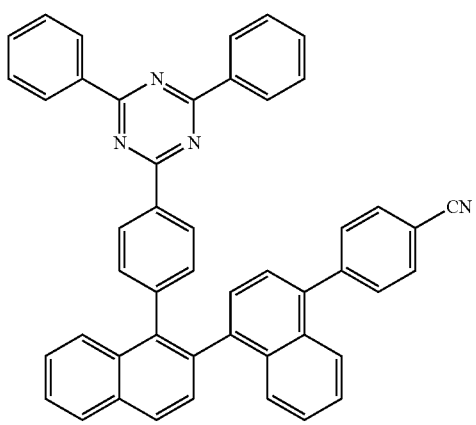

1-7

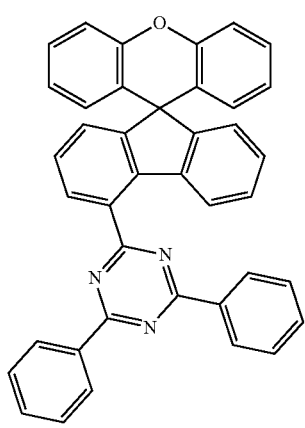

1-8

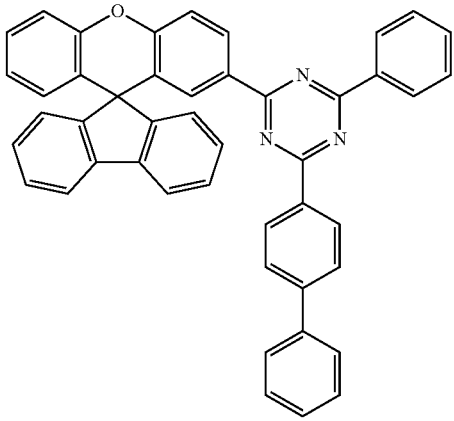

1-9

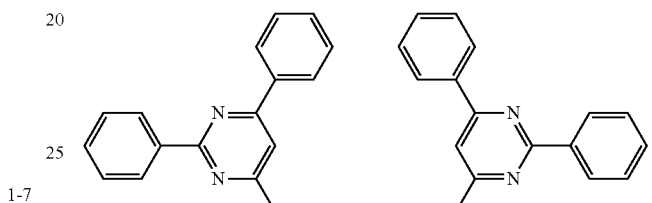

1-10

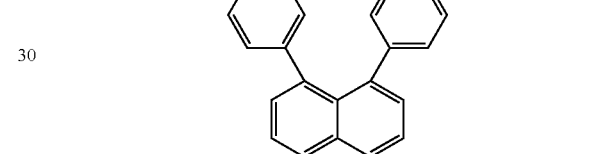

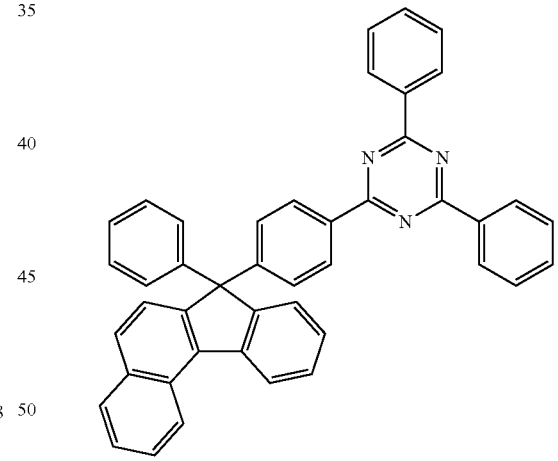

1-11

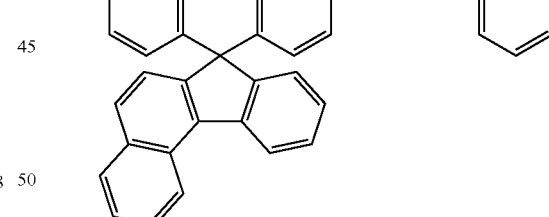

1) Plotting of C-V Curve

First, an electron transport material candidate 1-1 was dissolved in dimethylformamide (DMF) at a concentration of 3 mM, and then a current-potential (C-V) curve according to cyclic voltammetry was plotted with varying a scan rate (V/s) at 0.01, 0.05, 0.1, 0.3 and 0.5. The curve is shown in FIG. 3. In the C-V curve of FIG. 3, the upward peak is an anodic peak, and the downward peak is a cathodic peak.

2) Calculation of Electron Donating Rate Constant $k_d$ (Donating k)

a1) From the anodic peak of the C-V curve obtained in step 1), an anodic peak potential ($E_{pa}$) value was obtained with respect to each scan rate (V/s) of 0.01, 0.05, 0.1, 0.3, and 0.5, and then shown in the following Table 1. A graph where the x-axis is the scan rate (V/s) and the y-axis is the anodic peak potential ($E_{pa}$) was plotted, and the graph is shown in FIG. 4. After fitting to the Mathematical equation of FIG. 4, a, b, and c parameters were obtained. A formal potential ($E_a^{0'}$) value when x is 0 (the scan rate is 0) was obtained therefrom. The obtained formal potential ($E_a^{0'}$) was −1.914 V.

TABLE 1

| Scan rate (V/s) | $E_{pa}$ |
| --- | --- |
| 0.01 | −1.91219 |
| 0.05 | −1.90413 |
| 0.1 | −1.89866 |
| 0.3 | −1.88492 |
| 0.5 | −1.88056 | b1) By using the anodic peak potential ($E_{pa}$) value according to each scan rate obtained in the step a1), a graph where the x-axis is In(v) and the y-axis is the anodic peak potential ($E_{pa}$) was plotted, and the graph is shown in FIG. 5. After drawing a trend line on the graph of FIG. 5 and fitting to a straight line, the slope and the y-intercept were obtained. The obtained slope and y-intercept were 0.0084 and −1.8764, respectively.

c1) By using the formal potential ($E_a^{0'}$) value obtained in step a1) and the slope and the y-intercept obtained in the step b1), the electron donating rate constant $k_d$ (donating k) satisfying Mathematical equation 2-1 was calculated. Specifically, the y-intercept corresponds to $$E_a^{0'} - \left(\frac{RT}{\alpha nF}\right)\ln\left(\frac{RTk_d}{\alpha nF}\right),$$

and therefore, the formal potential ($E_a^{0'}$) value obtained in the step a1) and the slope $$\left(\frac{RT}{\alpha nF}\right)$$

value obtained in the step b1) were put to calculate the $k_d$ (donating k) value. The obtained $k_d$ (donating k) was 1.4178.

3) Calculation of Electron Accepting Rate Constant $k_a$ (Accepting k)

a2) From the cathodic peak of the C-V curve obtained in step 1), a cathodic peak potential ($E_{pc}$) value was obtained with respect to each scan rate (V/s) of 0.01, 0.05, 0.1, 0.3, and 0.5, and then shown in the following Table 2. A graph where the x-axis is the scan rate (V/s) and the y-axis is the cathodic peak potential ($E_{pc}$) was plotted, and the graph is shown in FIG. 6. After fitting to the Mathematical equation of FIG. 6, a, b, and c parameters were obtained. A formal potential ($E_c^{0'}$) value when x is 0 (the scan rate is 0) was obtained. The obtained formal potential ($E_c^{0'}$) was −1.9838 V.

TABLE 2

| Scan rate (V/s) | $E_{pc}$ |
| --- | --- |
| 0.01 | −1.98577 |
| 0.05 | −1.993 |
| 0.1 | −1.99872 |

TABLE 2-continued

| Scan rate (V/s) | $E_{pc}$ |
| --- | --- |
| 0.3 | −2.01334 |
| 0.5 | −2.02301 | b2) By using the cathodic peak potential ($E_{pc}$) value according to each scan rate obtained in the step a2), a graph where the x-axis is In(v) and the y-axis is the cathodic peak potential ($E_{pc}$) was plotted, and the graph is shown in FIG. 7. After drawing a trend line on the graph of FIG. 7 and fitting to a straight line, the slope and the y-intercept were obtained. The obtained slope and y-intercept were −0.0094 and −2.025, respectively.

c2) By using the formal potential ($E_c^{0'}$) value obtained in step a2) and the slope and the y-intercept obtained in the step b2), the electron accepting rate constant $k_a$ (accepting k) satisfying Mathematical equation 2-2 was calculated. Specifically, the y-intercept corresponds to $$E_c^{0'} + \left(\frac{RT}{\alpha nF}\right)\ln\left(\frac{RTk_a}{\alpha nF}\right),$$

and therefore, the formal potential ($E_c^{0'}$) value obtained in the step a2) and the slope $$-\left(\frac{RT}{\alpha nF}\right)$$

value obtained in the step b2) were put to calculate the $k_a$ (accepting k) value. The obtained $k_a$ (accepting k) was 1.3330.

4) Calculation of Heterogeneous Electron Transfer Rate Constant (K)

The heterogeneous electron transfer rate constant (K) was calculated using $k_d$ (donating k) obtained in the step 2) and $k_a$ (accepting k) obtained in the step 3) according to Mathematical equation 1, and as a result, the heterogeneous electron transfer rate constant (K) value of the electron transport material candidate 1-1 was 1.3754.

Heterogeneous electron transfer rate constant (K) was calculated for each of the electron transport material candidates, other than the electron transport material candidate 1-1, in the same manner as the electron transport material candidate 1-1, and the results are shown in Table 3.

TABLE 3

| Electron transport material candidate | $k_d$ (donating k) | $k_a$ (accepting k) | K |
| --- | --- | --- | --- |
| 1-1 | 1.4178 | 1.333 | 1.3754 |
| 1-2 | 1.8453 | 0.932 | 1.3887 |
| 1-3 | 1.7641 | 1.056 | 1.41 |
| 1-4 | 1.8733 | 0.9686 | 1.421 |
| 1-5 | 1.5644 | 1.2905 | 1.4275 |
| 1-6 | 1.226 | 1.6512 | 1.4386 |
| 1-7 | 1.9396 | 1.1778 | 1.5587 |
| 1-8 | 2.1158 | 1.0529 | 1.5844 |
| 1-9 | 1.8464 | 1.3496 | 1.598 |
| 1-10 | 1.2220 | 0.6561 | 0.9391 |
| 1-11 | 2.4358 | 0.9480 | 1.6918 |

(Step 2) Selection of Electron Transport Material Candidate Having Heterogeneous Electron Transfer Rate Constant (K) in a Range of 1.2 to 1.65 as Electron Transport Material of Organic Light Emitting Device Referring to Table 3, it was found that electron transport material candidates having a heterogeneous electron transfer rate constant (K) value of 1.2 to 1.65 were electron transport material candidates 1-1 to 1-9, and thus they were selected as an electron transport material of an organic light emitting device.

Thereafter, to compare a balance between efficiency and lifetime of organic light emitting devices employing each of the electron transport material candidates 1-1 to 1-9 selected as the electron transport material and organic light emitting devices employing each of the electron transport material candidates 1-10 and 1-11 not selected as the electron transport material, the following experiments were performed.

Manufacture of Organic Light Emitting Device

Experiment 1-1

As an anode, a substrate on which ITO was deposited at 30 Å was cut to a size of 50 mm×50 mm×0.5 mm, and immersed in distilled water where a detergent was dissolved, and washed by ultrasonic waves. As the detergent, a product available from Fisher Co. was used. As the distilled water, distilled water filtered twice by using a filter available from Millipore Co. was used. The ITO was washed for 30 minutes, and ultrasonic washing was then repeated twice for 10 minutes by using distilled water. After the completion of washing with distilled water, ultrasonic washing was performed using isopropyl alcohol, acetone, and methanol solvent in this order, followed by drying.

A compound HTL1 and P1 were vacuum-deposited at a weight ratio of 97:3 on the prepared anode to form a hole injection layer in a thickness of 106 Å. Then, the compound HTL1 was vacuum-deposited on the hole injection layer in a thickness of 1000 Å to form a hole transport layer. Then, a compound HTL2 was vacuum-deposited on the hole transport layer in a thickness of 40 Å to form an electron blocking layer.

Next, a host BH and a dopant BD were vacuum-deposited at a weight ratio of 97:3 on the electron blocking layer to form a light emitting layer in a thickness of 190 Å.

Then, a hole blocking material ETL1 was deposited on the light emitting layer in a thickness of 50 Å to form a hole blocking layer. Then, the electron transport material candidate 1-1 and LiQ were vacuum-deposited at a weight ratio of 50:50 to form an electron transport layer in a thickness of 250 Å. Subsequently, LiQ with a thickness of 7 Å was used to form an electron injection layer, and magnesium and silver (10:1) were used to form a cathode in a thickness of 100 Å. A capping layer (CPL) was deposited in a thickness of 800 Å to complete a device.

In the above process, a deposition rate of the organic material was maintained at 1 Å/sec. At this time, the vacuum deposition of each layer was performed using a cluster-type 1.0E-7 vacuum evaporator (manufactured by Selcos).

Experiments 1-2 to 1-11

Each organic light emitting device was manufactured in the same manner as in the experiment 1-1, except that each of materials described in the following Table 4 was used as the electron transport material.

The compounds used in the experiments are the same as follows:

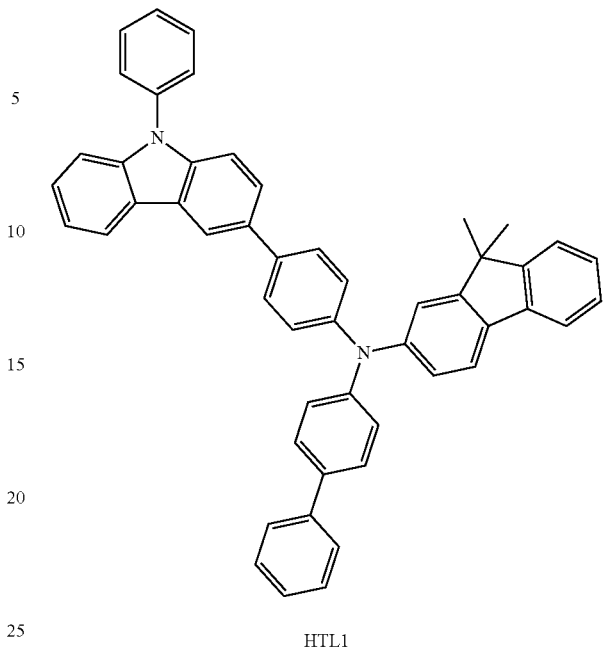

HTL1

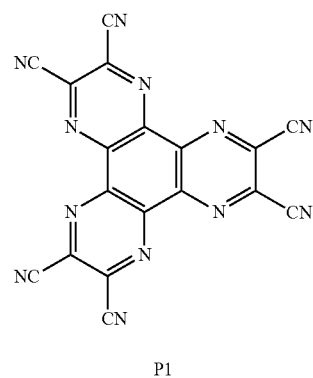

P1

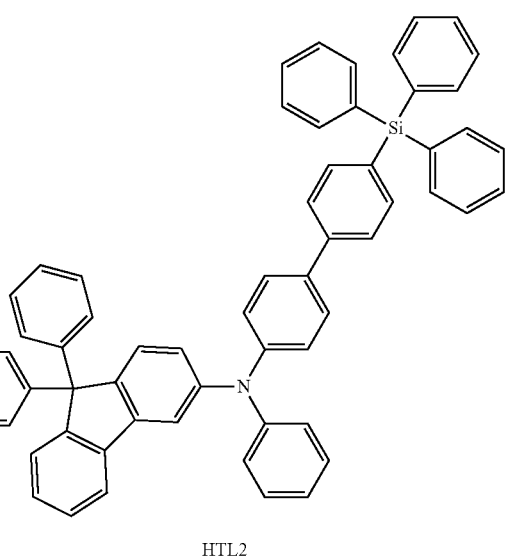

HTL2

-continued

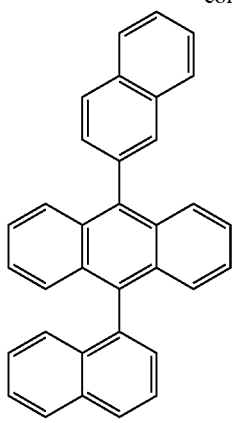

BH

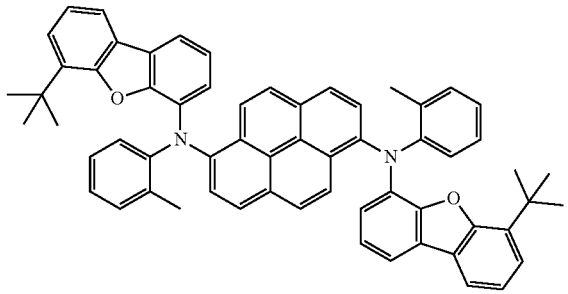

BD

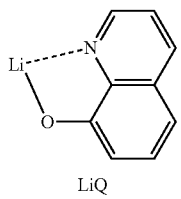

LiQ

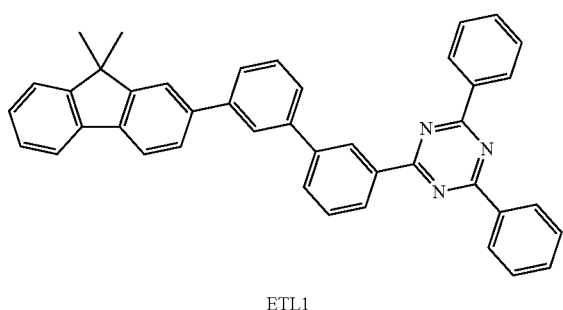

ETL1

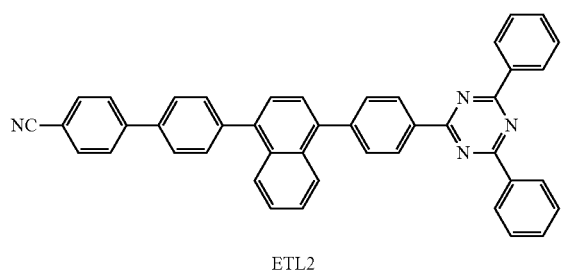

ETL2

Characterization of Device According to K Value of Electron Transport Material

Current efficiency and lifetime (T95) were measured using PR-655 IVL available from Photo Research, when current was applied to the organic light emitting devices manufactured in the experiments 1-1 to 1-11, and the results are shown in the following Table 4. At this time, lifetime (T95) means the time to be taken until the luminance reaches 95% of the initial luminance.

Further, to evaluate a balance between current efficiency and lifetime of the organic light emitting devices according to K values of the electron transport materials, evaluation criteria (a) was calculated by considering ranges of the efficiency and lifetime values as in the following Equation 1, and the results are shown in the following Table 4.

Evaluation criteria (α)=Current efficiency+(lifetime)/100   [Equation 1]

TABLE 4

| | Electron transport material candidate | K value | Current efficiency (cd/A@10 mA/cm$^2$) | T95 (hr@ 950nit) | Evaluation criteria (α) |
|---|---|---|---|---|---|
| Experiment 1-1 | 1-1 | 1.3754 | 7.56 | 183 | 9.39 |
| Experiment 1-2 | 1-2 | 1.3887 | 7.70 | 167 | 9.37 |
| Experiment 1-3 | 1-3 | 1.41 | 7.49 | 183 | 9.32 |
| Experiment 1-4 | 1-4 | 1.421 | 7.42 | 167 | 9.09 |
| Experiment 1-5 | 1-5 | 1.4275 | 7.42 | 169 | 9.11 |
| Experiment 1-6 | 1-6 | 1.4386 | 7.29 | 208 | 9.37 |
| Experiment 1-7 | 1-7 | 1.5587 | 7.36 | 175 | 9.11 |
| Experiment 1-8 | 1-8 | 1.5844 | 7.70 | 153 | 9.23 |
| Experiment 1-9 | 1-9 | 1.598 | 7.56 | 145 | 9.01 |
| Experiment 1-10 | 1-10 | 0.9391 | 7.42 | 156 | 8.98 |
| Experiment 1-11 | 1-11 | 1.6918 | 7.63 | 134 | 8.97 |

Referring to Table 4, the organic light emitting devices, each employing, as an electron transport material, the material having a heterogeneous electron transfer rate constant (K) value within the range of 1.2 to 1.65, were found to have the evaluation criteria value of 9 or more, unlike the devices, each employing, as an electron transport material, the material having a heterogeneous electron transfer rate constant (K) value out of the above range, indicating an excellent balance between current efficiency and lifetime.

Experimental Example 2: Method of Screening for Hole Blocking Material (Step i) Calculation of Electron Donating Rate Constant $k_d$ (Donating k) of Hole Blocking Material Candidates With respect to the following hole blocking material candidates 2-1 to 2-10, each including N atom-containing 6-membered heteroaromatic ring, an electron donating rate constant $k_d$ (donating k) was calculated in the same manner as the electron transport material candidate 1-1 of Experimental Example 1, respectively, and the results are shown in Table 5.

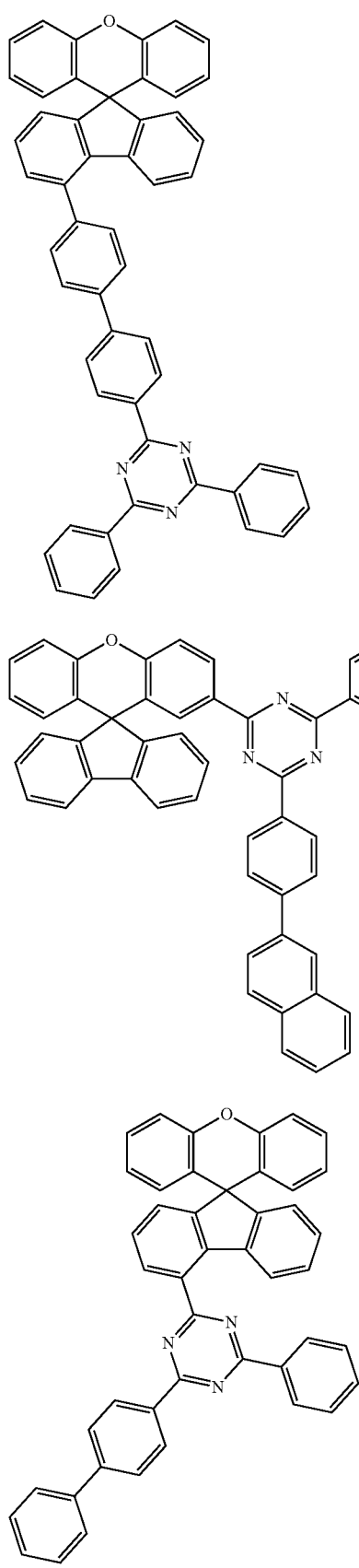
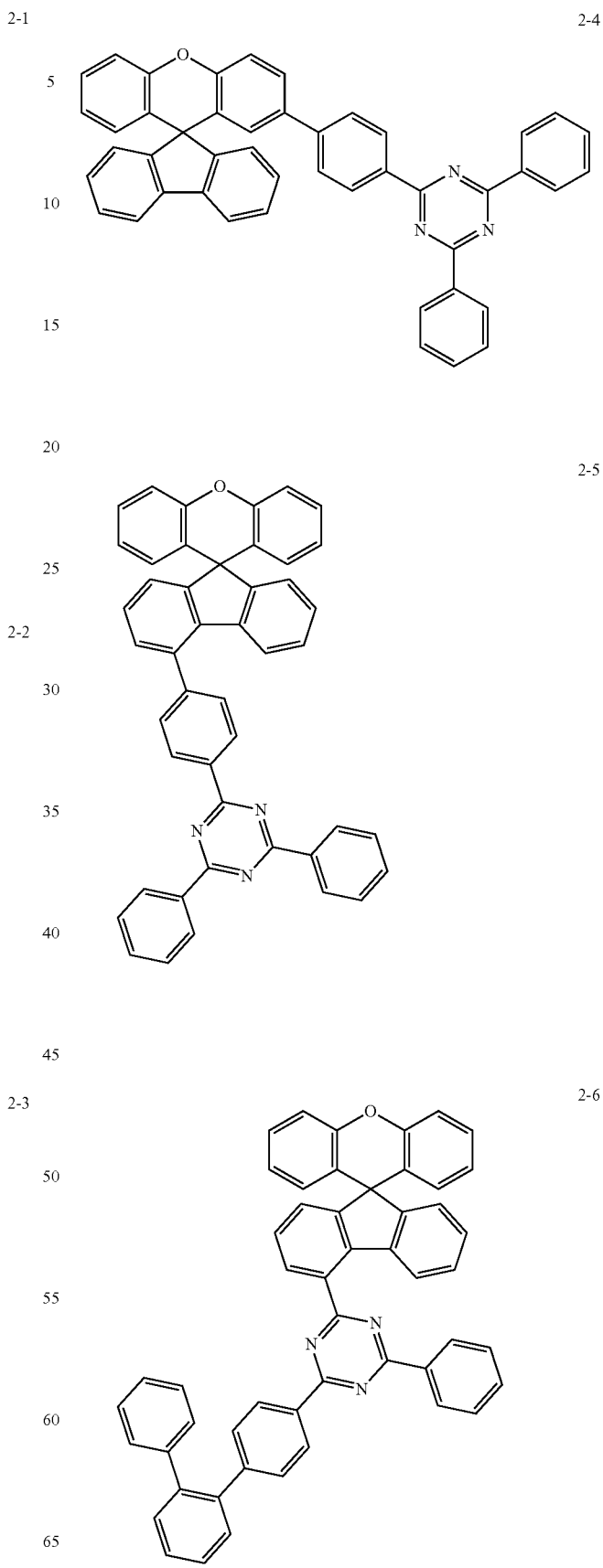

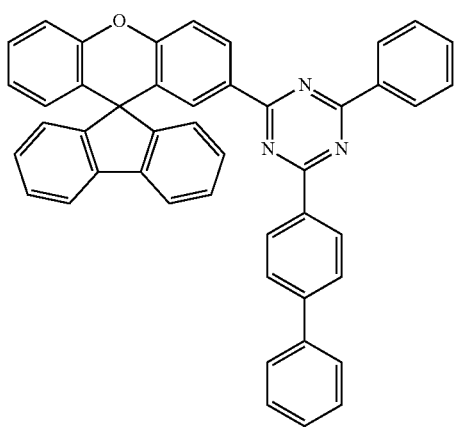

2-7

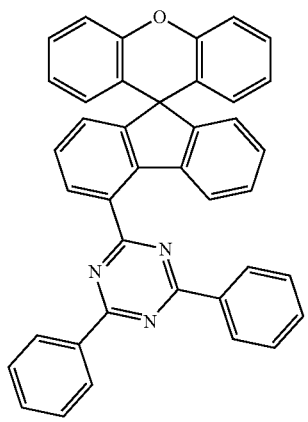

2-8

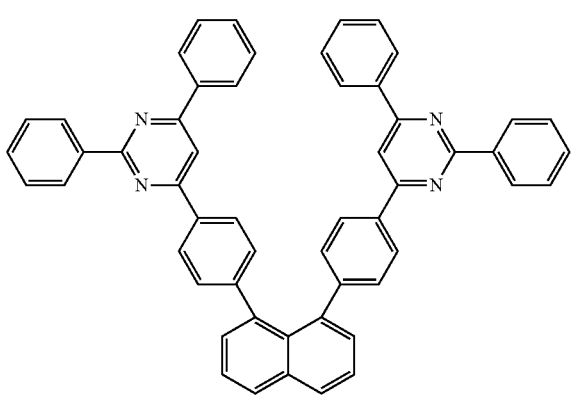

2-9

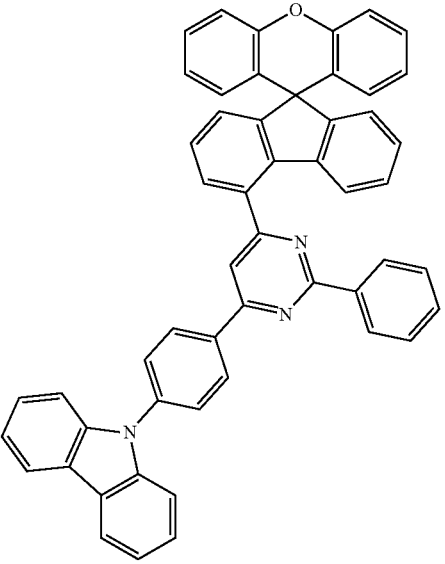

2-10

TABLE 5

| Hole blocking material candidate | $k_d$ (donating k) |
|---|---|
| 2-1 | 1.3685 |
| 2-2 | 1.4178 |
| 2-3 | 1.5993 |
| 2-4 | 1.7641 |
| 2-5 | 1.8571 |
| 2-6 | 1.8453 |
| 2-7 | 1.8464 |
| 2-8 | 2.1158 |
| 2-9 | 1.2220 |
| 2-10 | 2.7261 |

(Step ii) Selection of Hole Blocking Material Candidate Having Electron Donating Rate Constant $k_d$ (Donating k) Value of 1.25 to 2.25 as Hole Blocking Material of Organic Light Emitting Device Referring to Table 5, it was found that hole blocking material candidates having an electron donating rate constant $k_d$ (donating k) value of 1.25 to 2.25 were hole blocking material candidates 2-1 to 2-8, and thus they were selected as a hole blocking material of an organic light emitting device.

Thereafter, to compare a balance between efficiency and lifetime of organic light emitting devices employing each of the hole blocking material candidates 2-1 to 2-8 selected as the hole blocking material and organic light emitting devices employing each of the hole blocking material candidates 2-9 and 2-10 not selected as the hole blocking material, the following experiments were performed.

Manufacture of Organic Light Emitting Device

Experiment 2-1

As an anode, a substrate on which ITO was deposited at 30 Å was cut to a size of 50 mm×50 mm×0.5 mm, and immersed in distilled water where a detergent was dissolved, and washed by ultrasonic waves. As the detergent, a product available from Fisher Co. was used. As the distilled water, distilled water filtered twice by using a filter available from Millipore Co. was used. The ITO was washed for 30 minutes, and ultrasonic washing was then repeated twice for 10 minutes by using distilled water. After the completion of washing with distilled water, ultrasonic washing was performed using isopropyl alcohol, acetone, and methanol solvent in this order, followed by drying.

A compound HTL1 and P1 were vacuum-deposited at a weight ratio of 97:3 on the prepared anode to form a hole injection layer in a thickness of 106 Å. Then, the compound HTL1 was vacuum-deposited on the hole injection layer in a thickness of 1000 Å to form a hole transport layer. Then, a compound HTL2 was vacuum-deposited on the hole transport layer in a thickness of 40 Å to form an electron blocking layer.

Next, a host BH and a dopant BD were vacuum-deposited at a weight ratio of 97:3 on the electron blocking layer to form a light emitting layer in a thickness of 190 Å.

Then, the hole blocking material candidate 2-1 was deposited on the light emitting layer in a thickness of 50 Å to form a hole blocking layer. Then, the electron transport material ETL2 and LiQ were vacuum-deposited at a weight ratio of 50:50 to form an electron transport layer in a thickness of 250 Å. Subsequently, LiQ with a thickness of 7 Å was used to form an electron injection layer, and magnesium and silver (10:1) were used to form a cathode in a thickness of 100 Å. A capping layer (CPL) was deposited in a thickness of 800 Å to complete a device.

In the above process, a deposition rate of the organic material was maintained at 1 Å/sec. At this time, the vacuum deposition of each layer was performed using a cluster-type 1.0E-7 vacuum evaporator (manufactured by Selcos).

Experiments 2-2 to 2-10

Each organic light emitting device was manufactured in the same manner as in the experiment 2-1, except that each of materials described in the following Table 6 was used as the hole blocking material.

Characterization of Device According to $k_d$ (Donating k) Value of Hole Blocking Material Current efficiency and lifetime (T95) were measured using PR-655 IVL available from Photo Research, when current was applied to the organic light emitting devices manufactured in the experiments 2-1 to 2-10, and the results are shown in the following Table 6. At this time, lifetime (T95) means the time to be taken until the luminance reaches 95% of the initial luminance.

Further, to evaluate a balance between current efficiency and lifetime of the organic light emitting devices according to $k_d$ values of the hole blocking materials, evaluation criteria (α) was calculated by considering ranges of the efficiency and lifetime values as in the Equation 1, and the results are shown in the following Table 6.

TABLE 6

| | Hole blocking material candidate | $k_d$ value | Current efficiency (cd/A@ 10 mA/cm$^2$) | T95 (hr@ 950nit) | Evaluation criteria (α) |
|---|---|---|---|---|---|
| Experiment 2-1 | 2-1 | 1.3685 | 6.28 | 320 | 9.48 |
| Experiment 2-2 | 2-2 | 1.4178 | 6.15 | 337 | 9.52 |
| Experiment 2-3 | 2-3 | 1.5993 | 5.88 | 357 | 9.45 |
| Experiment 2-4 | 2-4 | 1.7641 | 6.89 | 229 | 9.18 |
| Experiment 2-5 | 2-5 | 1.8571 | 6.82 | 220 | 9.02 |
| Experiment 2-6 | 2-6 | 1.8453 | 6.42 | 263 | 9.05 |
| Experiment 2-7 | 2-7 | 1.8464 | 6.35 | 289 | 9.24 |
| Experiment 2-8 | 2-8 | 2.1158 | 6.89 | 232 | 9.21 |
| Experiment 2-9 | 2-9 | 1.2220 | 6.42 | 17 | 6.59 |
| Experiment 2-10 | 2-10 | 2.7261 | 7.89 | 76 | 8.65 |

Referring to Table 6, the organic light emitting devices, each employing, as a hole blocking material, the material having an electron donating rate constant $k_d$ (donating k) value within the range of 1.25 to 2.25, were found to have the evaluation criteria value of 9 or more, unlike the devices, each employing, as a hole blocking material, the material having an electron donating rate constant $k_d$ (donating k) value out of the above range, indicating an excellent balance between current efficiency and lifetime.

| [Reference numerals] | |
|---|---|
| 1: Substrate | 2: Anode |
| 3: Hole transport layer | 4: Light emitting layer |
| 5: Electron transport layer | 6: Cathode |
| 7: Hole injection layer | 8: Electron blocking layer |
| 9: Hole blocking layer | 10: Electron injection layer |

The invention claimed is:

1. A method of screening for an electron transport material included in an electron transport layer of an organic light emitting device, the method comprising the steps of:
   1) calculating heterogeneous electron transfer rate constant (K) of electron transport material candidates by the following Mathematical equation 1; and
   2) determining an electron transport material candidate of which the heterogeneous electron transfer rate constant (K) value calculated by the following Mathematical equation 1 is 1.2 to 1.65 as the electron transport material of the organic light emitting device, $$K = \frac{k_d + k_a}{2} \quad \text{[Mathematical equation 1]}$$

in Mathematical equation 1,
$k_d$ represents an electron donating rate constant and $k_a$ represents an electron accepting rate constant.

2. The method of claim 1,
wherein in the step 1),
the heterogeneous electron transfer rate constant (K) of the electron transport material candidate is calculated by using an electron donating rate constant $k_d$ (donating k) value obtained from an anodic peak of a current-potential (C-V) curve and an electron accepting rate constant $k_a$ (accepting k) value obtained from a cathodic peak of the C-V curve, after dissolving the electron transport material candidate in dimethylformamide (DMF), and plotting the C-V curve according to cyclic voltammetry.

3. The method of claim 2,
wherein the C-V curve of the electron transport material candidate is measured at a scan rate of 0.01 V/s to 0.5 V/s.

4. The method of claim 1,
wherein the electron transport material is included together with a metal complex compound in the electron transport layer.

5. A method of screening for a hole blocking material included in a hole blocking layer of an organic light emitting device, the method comprising the steps of:
   1i) calculating electron donating rate constant $k_d$ of hole blocking material candidates by the following Mathematical equation 2-1; and
   2ii) determining a hole blocking material candidate of which the electron donating rate constant $k_d$ value calculated by the following Mathematical equation 2-1 is 1.25 to 2.25 as the hole blocking material of the organic light emitting device $$E_{pa} = E_a^{0\prime} - \left(\frac{RT}{\alpha nF}\right)\ln\left(\frac{RTk_d}{\alpha nF}\right) + \left(\frac{RT}{\alpha nF}\right)\ln v \quad \text{[Mathematical equation 2-1]}$$

in Mathematical equation 2-1, $E_{pa}$ represents an anodic peak potential at a maximum current, $E_a^{0\prime}$ represents a formal potential at an anodic peak, v represents a scan rate, $\alpha$ represents an electron transfer coefficient, n represents the number of electrons, F represents the Faraday constant (96480 C/mol), R represents the gas constant (8.314 $mol^{-1}K^{-1}$), and T represents the absolute temperature (298 K).

6. The method of claim 5, wherein in the step 1), the electron donating rate constant $k_d$ (donating k) of the hole blocking material candidate is calculated from an anodic peak of a current-potential (C-V) curve, after dissolving the hole blocking material candidate in dimethylformamide (DMF), and plotting the C-V curve according to cyclic voltammetry.

7. The method of claim 6, wherein the C-V curve of the hole blocking material candidate is measured at a scan rate of 0.01 V/s to 0.5 V/s.

* * * * *